US012710489B2

(12) United States Patent
Hiraki et al.

(10) Patent No.: US 12,710,489 B2
(45) Date of Patent: Aug. 18, 2026

(54) MAGNETIC SENSOR

(71) Applicant: TDK CORPORATION, Tokyo (JP)

(72) Inventors: Tetsuya Hiraki, Tokyo (JP); Atsushi Matsuo, Tokyo (JP); Yoshitaka Sasaki, Uniondale, NY (US)

(73) Assignee: TDK CORPORATION, Tokyo (JP)

( * ) Notice: Subject to any disclaimer, the term of this patent is extended or adjusted under 35 U.S.C. 154(b) by 196 days.

(21) Appl. No.: 18/664,893

(22) Filed: May 15, 2024

(65) Prior Publication Data

US 2025/0355067 A1 Nov. 20, 2025

(51) Int. Cl.
*G01R 33/09* (2006.01)

(52) U.S. Cl.
CPC ......... *G01R 33/098* (2013.01); *G01R 33/093* (2013.01)

(58) Field of Classification Search
CPC ............................ G01R 33/098; G01R 33/093
See application file for complete search history.

(56) References Cited

U.S. PATENT DOCUMENTS 6,477,009 B1 * 11/2002 Watson .................. G11B 5/584
2002/0186011 A1 * 12/2002 Murata .................. H10N 59/00 257/E27.005
2018/0113176 A1 4/2018 Nagata et al.

* cited by examiner

*Primary Examiner* — Stephanie E Bloss
*Assistant Examiner* — Michael A Harrison
(74) *Attorney, Agent, or Firm* — Oliff PLC

(57) ABSTRACT

A magnetic sensor includes: a magnetic detection element; a magnetic layer having a first surface and a second surface located opposite to each other in a reference direction and a side surface connecting the first surface and the second surface; and a surrounding layer that is formed of an organic material or a glass material and that is disposed entirely covering the side surface of the magnetic layer. The magnetic detection element is disposed at a position closer to the first surface than the second surface. The surrounding layer is not provided between the first surface of the magnetic layer and the magnetic detection element in the reference direction.

14 Claims, 14 Drawing Sheets

MAGNETIC SENSOR

BACKGROUND

The technology relates to a magnetic sensor including a magnetic detection element and a magnetic layer.

Magnetic sensors using magnetic detection elements have been used for various applications in recent years. A system including a magnetic sensor may be intended to detect a perpendicular magnetic field in a direction perpendicular to a surface of a substrate by using a magnetic detection element having sensitivity in a direction parallel to the surface of the substrate. In such a case, a yoke that converts the perpendicular magnetic field into a parallel magnetic field in the direction parallel to the surface of the substrate is provided so that the perpendicular magnetic field can be detected.

In the magnetic sensor provided with the yoke as described above, the parallel magnetic field obtained by conversion in the yoke is a detection target magnetic field. Besides the detection target magnetic field, another parallel magnetic field that is not a detection target can be applied to the magnetic detection element. Thus, in the magnetic sensor provided with the yoke as described above, a magnetic shield to selectively attenuate such another parallel magnetic field that is not a detection target is provided.

US 2018/0,113,176 A1 discloses a magnetic field detection device including a soft magnetic layer that behaves as a magnetic yoke for an external magnetic field component in a Z-axis direction and that behaves as a magnetic shield for an external magnetic field component in a Y-axis direction.

In magnetic sensors provided with a magnetic layer such as a yoke or a magnetic shield, in order to achieve desired characteristics, the magnetic layer may be desired to have a large thickness. In general, around the magnetic layer, an insulating layer is provided. The larger the thickness of the magnetic layer, the larger the thickness of the insulating layer. With an increase in the thickness of the insulating layer, the insulating layer is likely to have a crack in the manufacturing process. In order for this to be prevented, it is conceivable that a magnetic layer having a relatively small thickness is formed a plurality of times. This has, however, a problem in that the number of steps is increased, causing a high cost for manufacturing the magnetic sensor.

SUMMARY

A magnetic sensor according to an embodiment of the technology includes: at least one magnetic detection element configured to detect a target magnetic field; a magnetic layer having a first surface and a second surface located opposite to each other in a reference direction and a side surface connecting the first surface and the second surface; and a surrounding layer that is formed of an organic material or a glass material and that is disposed entirely covering the side surface of the magnetic layer. The at least one magnetic detection element is disposed at a position closer to the first surface than the second surface. The surrounding layer is not provided between the first surface of the magnetic layer and the at least one magnetic detection element in the reference direction.

A magnetic sensor according to another embodiment of the technology includes: a magnetic detection element configured to detect a target magnetic field; a magnetic layer having a first surface and a second surface located opposite to each other in a reference direction and a side surface connecting the first surface and the second surface; and a surrounding layer that is formed of an organic material or a glass material and that is disposed entirely covering the side surface of the magnetic layer. The magnetic detection element is disposed at a position closer to the first surface than the second surface. The magnetic detection element overlaps, when seen in the reference direction, with the magnetic layer but not with the surrounding layer.

A magnetic sensor according to yet another embodiment of the technology includes: a magnetic detection element configured to detect a target magnetic field; a magnetic layer having a first surface and a second surface located opposite to each other in a reference direction and a side surface connecting the first surface and the second surface; and a surrounding layer that is formed of an organic material or a glass material and that is disposed entirely covering the side surface of the magnetic layer. The magnetic detection element is disposed at a position closer to the first surface than the second surface. The magnetic detection element overlaps, when seen in the reference direction, with the surrounding layer. At least a part of the magnetic detection element does not overlap, when seen in the reference direction, with the magnetic layer.

In the technology, the surrounding layer formed of an organic material or a glass material is disposed entirely covering the side surface of the magnetic layer. With this, the technology allows the cost for manufacturing the magnetic sensor to be reduced, with the thickness of the magnetic layer made large.

Other and further objects, features and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
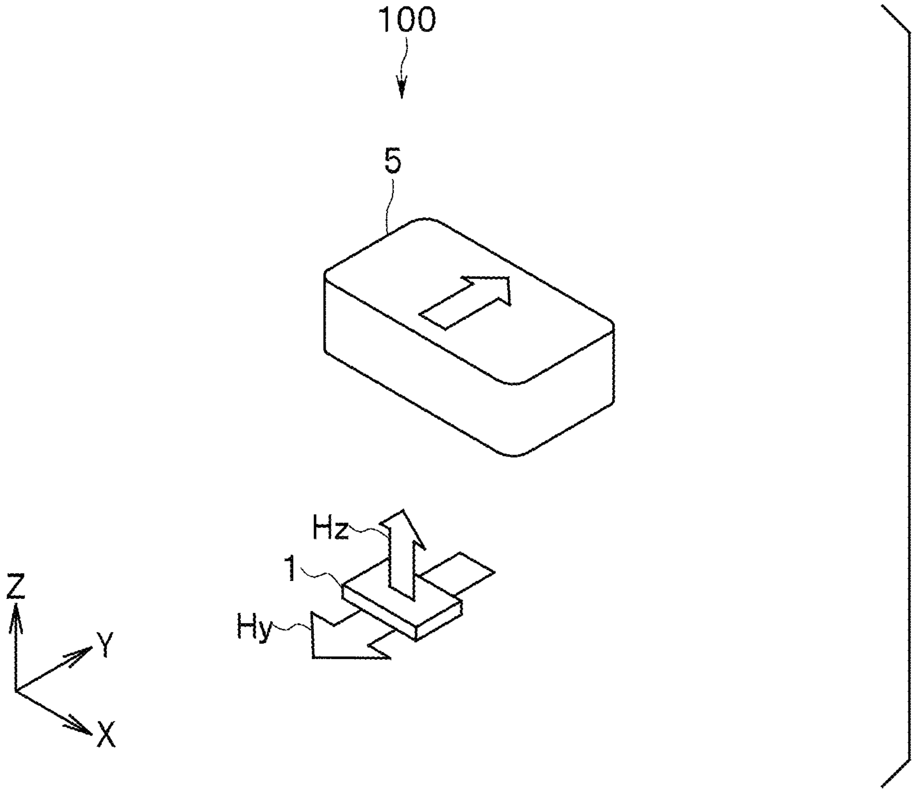
FIG. 1 is a perspective view showing essential parts of a magnetic sensor system including a magnetic sensor according to a first example embodiment of the technology.

An object of the technology is to provide a magnetic sensor that allows the manufacturing cost to be reduced, with a thickness of a magnetic layer made large.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. The description is given in the following order.

First Example Embodiment

A configuration of a magnetic sensor system including a magnetic sensor according to a first example embodiment of the technology will initially be described with reference to FIG. 1. FIG. 1 is a perspective view showing a magnetic sensor system including a magnetic sensor according to the example embodiment.

A magnetic sensor system 100 includes a magnetic sensor 1 according to the example embodiment and a magnetic field generation unit 5 that generates a predetermined magnetic field. In the example embodiment, the magnetic field generation unit 5 is a magnet configured such that a part of a magnetic field generated, or a partial magnetic field, is applied to the magnetic sensor 1.

Now, X, Y, and Z directions are defined as shown in FIG. 1. The X, Y, and Z directions are orthogonal to one another. The opposite directions to the X, Y, and Z directions will be referred to as −X, −Y, and −Z directions, respectively.

Hereinafter, the term "above" refers to positions located forward of a reference position in the Z direction, and "below" refers to positions opposite to the "above" positions with respect to the reference position. For each component of the magnetic sensor system 100, the term "top surface" refers to a surface of the component lying at the end thereof in the Z direction, and "bottom surface" refers to a surface of the component lying at the end thereof in the −Z direction. The expression "when seen in a predetermined direction (for example, Z direction)" means that an intended object is seen from a position at a distance in the predetermined direction or a direction parallel to the predetermined direction.

The partial magnetic field includes a first magnetic field component Hz parallel to the Z direction and a second magnetic field component Hy parallel to the Y direction. As shown in FIG. 1, the magnetization of the magnetic field generation unit 5 is in the Y direction, and the direction of the second magnetic field component Hy is the −Y direction. The direction of the first magnetic field component Hz is the Z direction if the magnetic field generation unit 5 moves in the Y direction from a predetermined position, and is the −Z direction if the magnetic field generation unit 5 moves in the −Y direction from the predetermined position.

Figure 2:
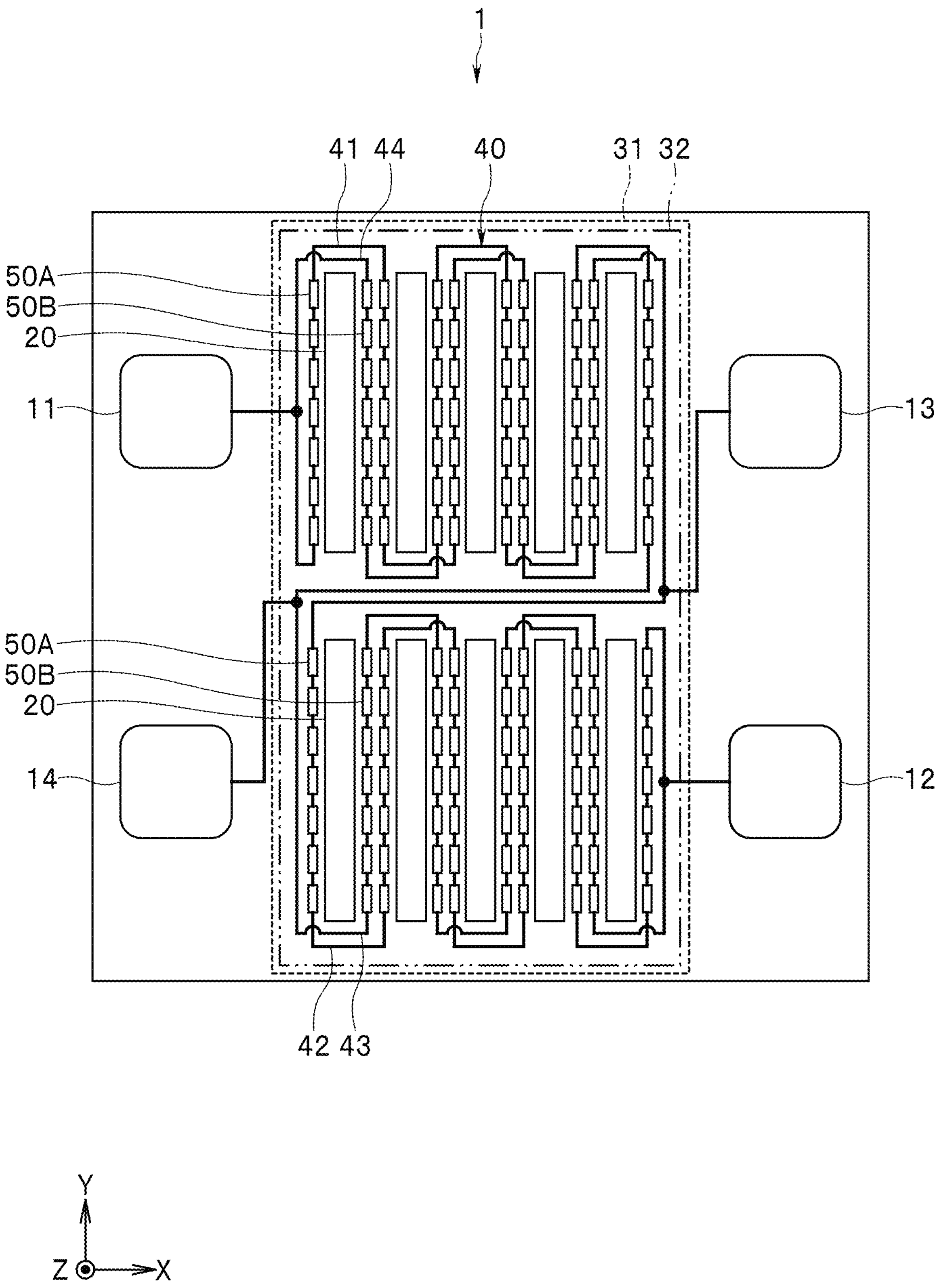
FIG. 2 is a plan view showing the magnetic sensor according to the first example embodiment of the technology.
Figure 3:
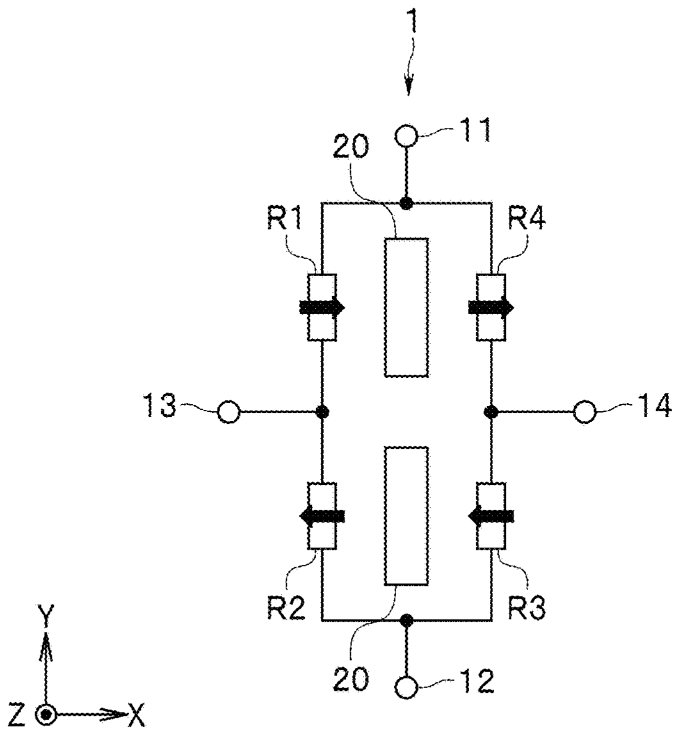
FIG. 3 is a circuit diagram showing a circuit configuration of the magnetic sensor according to the first example embodiment of the technology.
Figure 4:
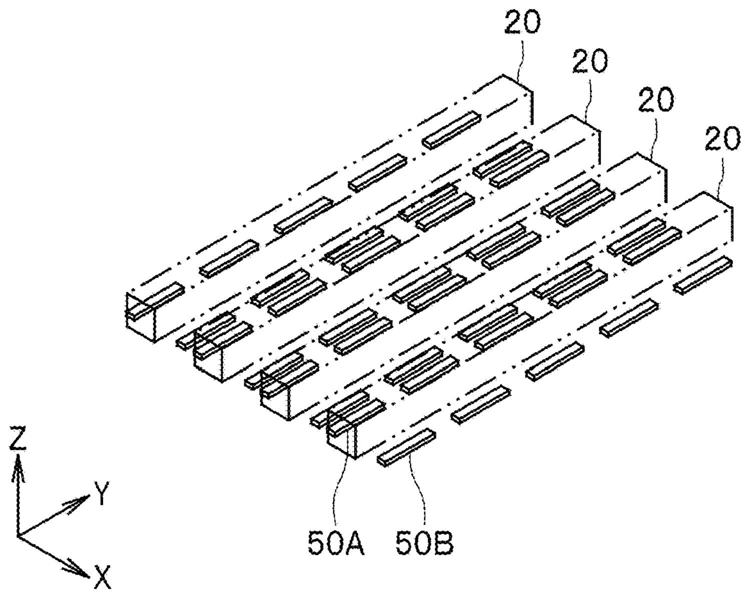
FIG. 4 is a perspective view showing a part of the magnetic sensor according to the first example embodiment of the technology.
Figure 5:
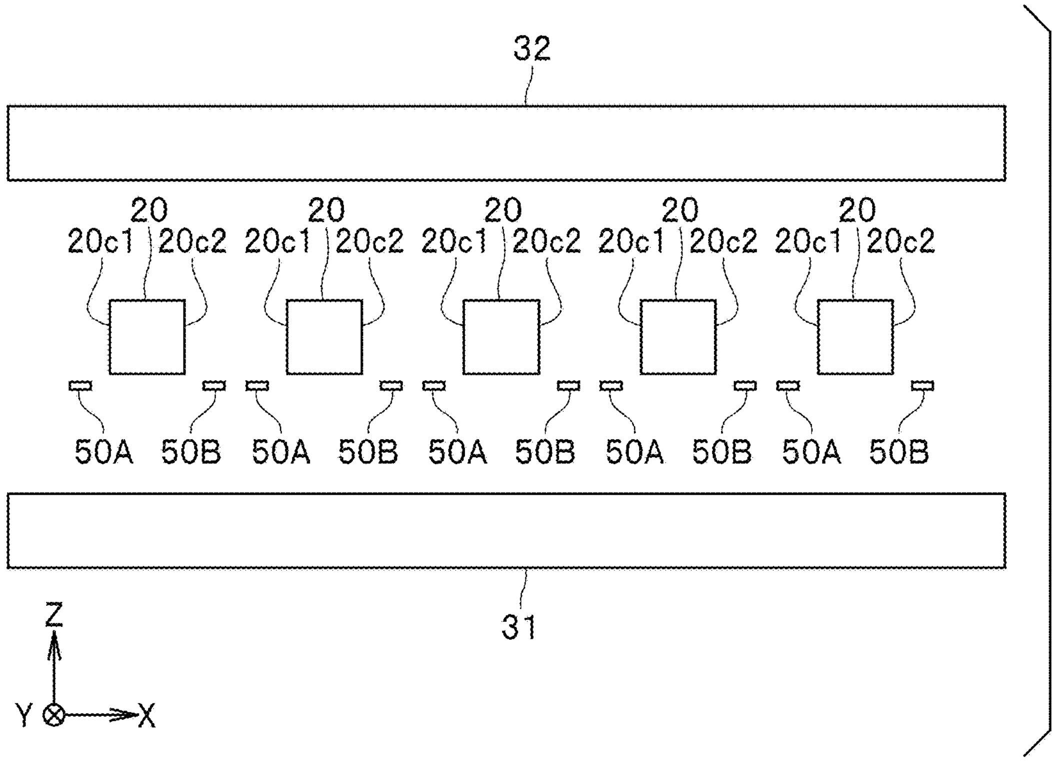
FIG. 5 is a side view showing a part of the magnetic sensor according to the first example embodiment of the technology.

Next, a configuration of the magnetic sensor 1 will be described in detail with reference to FIGS. 2 to 5. FIG. 2 is a plan view showing the magnetic sensor 1. FIG. 3 is a circuit diagram showing a circuit configuration of the magnetic sensor 1. FIG. 4 is a perspective view showing a part of the magnetic sensor 1. FIG. 5 is a side view showing a part of the magnetic sensor 1.

The magnetic sensor 1 includes four resistor sections R1, R2, R3, and R4, a power supply terminal 11, a ground terminal 12, a first output terminal 13, and a second output terminal 14. The resistor section R1 is provided between the power supply terminal 11 and the first output terminal 13. The resistor section R2 is provided between the ground terminal 12 and the first output terminal 13. The resistor section R3 is provided between the ground terminal 12 and the second output terminal 14. The resistor section R4 is provided between the power supply terminal 11 and the second output terminal 14. A voltage or current of predetermined magnitude is applied to the power supply terminal 11. The ground terminal 12 is grounded.

The resistor sections R1 to R4 each include at least one magnetic detection element configured to detect a target magnetic field. In the example embodiment, the resistor sections R1 to R4 each include, as the at least one magnetic detection element, a plurality of magnetoresistive elements (hereinafter, referred to as MR elements) 50.

The magnetic sensor 1 further includes at least one first magnetic layer formed of a soft magnetic material and at least one second magnetic layer formed of a soft magnetic material. The at least one first magnetic layer and the at least one second magnetic layer are each disposed at a position different from that of the plurality of MR elements 50 in a direction parallel to the Z direction. In the example embodiment, the magnetic sensor 1 includes, as the at least one first magnetic layer, a plurality of yokes 20. The magnetic sensor 1 includes, as the at least one second magnetic layer, two magnetic shields 31 and 32.

The plurality of yokes 20 are disposed such that they are arranged in a direction parallel to the X direction and a direction parallel to the Y direction. Each of the plurality of yokes 20 has a long shape in the Y direction when seen in the Z direction. Each of the plurality of yokes 20 is configured to generate an output magnetic field when an input magnetic field including an input magnetic field component in the direction parallel to the Z direction is applied thereto. The output magnetic field includes an output magnetic field component that is in the direction parallel to the X direction and varies depending on the input magnetic field component. In the example embodiment, the input magnetic field component is the first magnetic field component Hz shown in FIG. 1.

Each of the plurality of yokes 20 has a first side surface 20*c*1 and a second side surface 20*c*2 located at both ends in the direction parallel to the X direction. The first side surface 20*c*1 of each of the plurality of yokes 20 is located at the end in the −X direction, and the second side surface 20*c*2 is located at the end in the X direction.

The plurality of MR elements 50 are disposed at positions where the respective output magnetic field components generated by the plurality of yokes 20 are applied to. In particular, in the example embodiment, each of the MR elements 50 is disposed near the end in the −Z direction of a respective one of the plurality of yokes 20. The plurality of MR elements 50 are disposed such that two or more MR elements 50 are arranged along the first side surface 20*c*1 or second side surface 20*c*2 of each of the plurality of yokes 20.

Hereinafter, of the plurality of MR elements 50, two or more MR elements arranged along the first side surface 20*c*1 are denoted by the reference numeral "50A", and two or more MR elements arranged along the second side surface 20*c*2 are denoted by the reference numeral "50B". The plurality of MR elements 50A may be connected in series and the plurality of MR elements 50B may be connected in series. The direction of the output magnetic field component received by the plurality of MR elements 50A and the direction of the output magnetic field component received by the plurality of MR elements 50B are opposite to each other.

When seen in the Z direction, the plurality of MR elements 50A and the plurality of MR elements 50B may or may not overlap with the plurality of yokes 20. In the examples shown in FIGS. 2, 4, and 5, when seen in the Z direction, the plurality of MR elements 50A and the plurality of MR elements 50B are disposed not to overlap with the plurality of yokes 20.

When seen in the Z direction, each of the two magnetic shields 31 and 32 is disposed to overlap with the plurality of MR elements 50 and the plurality of yokes 20. The magnetic shield 31 is located in front of the plurality of MR elements 50 and the plurality of yokes 20 in the −Z direction. The magnetic shield 32 is located in front of the plurality of MR elements 50 and the plurality of yokes 20 in the Z direction. A planer shape (shape when seen in the Z direction) of each of the magnetic shields 31 and 32 is, for example, a rectangular shape. The planer shape of the magnetic shield 31 may be the same as or different from the planer shape of the magnetic shield 32.

Figure 6:
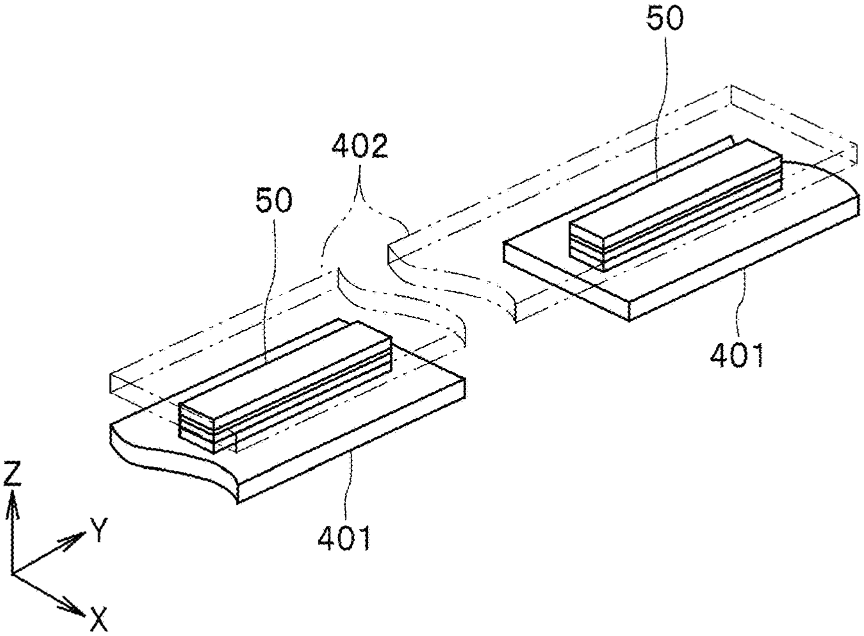
FIG. 6 is a perspective view showing a part of a wiring portion and magnetoresistive elements of the first example embodiment of the technology.

The magnetic sensor 1 further includes a wiring portion 40 that electrically connects the plurality of MR elements 50. The wiring portion 40 includes a plurality of lower electrodes 401 and a plurality of upper electrodes 402. Here, the plurality of lower electrodes 401 and the plurality of upper electrodes 402 will be described with reference to FIG. 6. FIG. 6 is a perspective view showing a part of the wiring portion 40 and MR elements 50. The plurality of MR elements 50 are disposed on the plurality of lower electrodes 401. The plurality of upper electrodes 402 are disposed on the plurality of MR elements 50.

The plurality of MR elements 50, the lower electrodes 401, and the upper electrodes 402 are connected in the following relationship. Each of the plurality of lower electrodes 401 has an elongated shape in the direction parallel to the Y direction. Two lower electrodes 401 adjoining in the direction parallel to the Y direction have a gap therebetween. On the top surface of each of the lower electrodes 401, near both ends in the direction parallel to the Y direction, the MR elements 50 are disposed. Each of the plurality of upper electrodes 402 electrically connects two adjoining MR elements 50 disposed on two lower electrodes 401 adjoining in the direction parallel to the Y direction. With this, two or more MR elements 50 arranged along the first side surface 20*c*1 or second side surface 20*c*2 of each of the plurality of yokes 20 are connected in series.

The wiring portion 40 further includes a plurality of connection electrodes. In each of the resistor sections R1 to R4, the plurality of connection electrodes electrically connect the plurality of lower electrodes 401 or the plurality of upper electrodes 402 such that a group of two or more MR elements 50 arranged in a row are connected in series.

Figure 7:
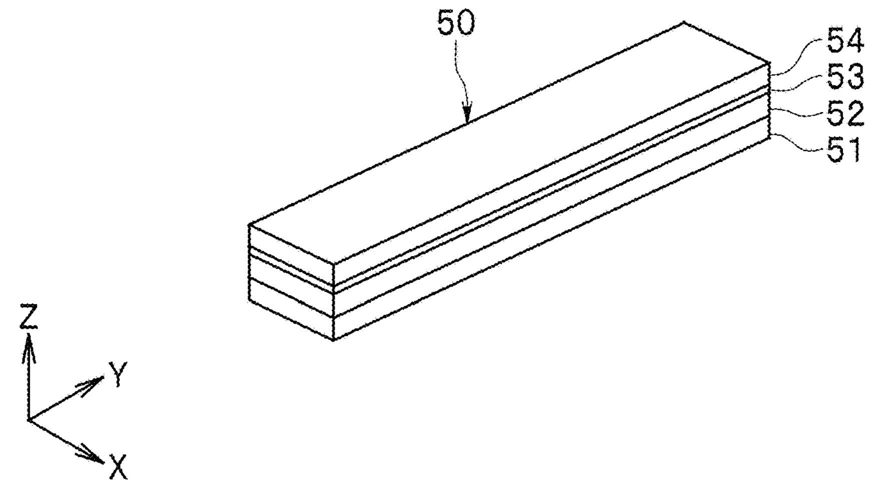
FIG. 7 is a perspective view showing the magnetoresistive element of the first example embodiment of the technology.

Here, a configuration of each MR element 50 will be described with reference to FIG. 7. FIG. 7 is a perspective view of an MR element 50. The MR element 50 is a spin-valve MR element. The MR element 50 includes a magnetization pinned layer 52 having a magnetization whose direction is fixed, a free layer 54 having a magnetization whose direction is variable depending on a direction of a magnetic field to be applied, and a gap layer 53 disposed between the magnetization pinned layer 52 and the free layer 54. The MR element 50 may be a tunneling magnetoresistive (TMR) element or a giant magnetoresistive (GMR) element. In the TMR element, the gap layer 53 is a tunnel barrier layer. In the GMR element, the gap layer 53 is a nonmagnetic conductive layer. The resistance of the MR element 50 varies depending on an angle that a direction of the magnetization of the free layer 54 forms with respect to a direction of the magnetization of the magnetization pinned layer 52. The resistance of the MR element 50 is at its minimum value when the foregoing angle is 0°, and at its maximum value when the foregoing angle is 180°.

In the example embodiment, the magnetization of the magnetization pinned layer 52 is in the direction parallel to the X direction. The free layer 54 of the MR element 50 has a shape anisotropy that sets the direction of the magnetization easy axis to be orthogonal to the direction of the magnetization of the magnetization pinned layer 52.

The MR element 50 further includes an antiferromagnetic layer 51. The antiferromagnetic layer 51, the magnetization pinned layer 52, the gap layer 53, and the free layer 54 are stacked in this order in the Z direction. The antiferromagnetic layer 51 is formed of an antiferromagnetic material, and is in exchange coupling with the magnetization pinned layer 52 so as to fix the direction of the magnetization of the magnetization pinned layer 52. The magnetization pinned layer 52 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled. In a case where the magnetization pinned layer 52 is the self-pinned layer, the antiferromagnetic layer 51 may be omitted.

Note that the layers 51 to 54 of the MR element 50 may be stacked in the reverse order to that shown in FIG. 7.

In FIG. 3, arrows shown overlapping with the resistor sections R1 to R4 indicate directions of the magnetizations of the respective magnetization pinned layers 52 in the resistor sections R1 to R4. In the example shown in FIG. 2, the magnetization of the magnetization pinned layer 52 in each of the resistor sections R1 and R4 is in the X direction. The magnetization of the magnetization pinned layer 52 in each of the resistor sections R2 and R3 is in the –X direction.

As shown in FIG. 2, the wiring portion 40 includes wirings 41, 42, 43, and 44. The wiring 41 connects a plurality of MR elements 50A each including the magnetization pinned layer 52 having the magnetization in the X direction. The wiring 42 connects a plurality of MR elements 50A each including the magnetization pinned layer 52 having the magnetization in the –X direction. The wiring 43 connects a plurality of MR elements 50B each including the magnetization pinned layer 52 having the magnetization in the –X direction. The wiring 44 connects a plurality of MR elements 50B each including the magnetization pinned layer 52 having the magnetization in the X direction.

The resistor section R1 includes the plurality of MR elements 50A connected by the wiring 41. The resistor section R2 includes the plurality of MR elements 50A connected by the wiring 42. The resistor section R3 includes the plurality of MR elements 50B connected by the wiring 43. The resistor section R4 includes the plurality of MR elements 50B connected by the wiring 44.

Next, the operation of the magnetic sensor 1 will be described. When there is no first magnetic field component Hz and, as a result, no magnetic field component to be generated by the plurality of yokes 20, the magnetization of the free layer 54 in each of the plurality of MR elements 50A and the plurality of MR elements 50B is in the direction parallel to the Y direction.

When there exists the first magnetic field component Hz in the Z direction, the output magnetic field component received by each of the plurality of MR elements 50A included in the resistor sections R1 and R2 is in the X direction, and the output magnetic field component received by each of the plurality of MR elements 50B included in the resistor sections R3 and R4 is in the –X direction. In such a case, the direction of the magnetization of the free layer 54 of each of the plurality of MR elements 50A tilts toward the X direction from the direction parallel to the Y direction, and the direction of the magnetization of the free layer 54 of each of the plurality of MR elements 50B tilts toward the –X direction from the direction parallel to the Y direction. As a result, as compared to a state where there is no output magnetic field component, the resistance value of each of the plurality of MR elements 50A included in the resistor section R1 and the resistance value of each of the plurality of MR elements 50B included in the resistor section R3 decrease, and the resistance value of each of the plurality of MR elements 50A included in the resistor section R2 and the resistance value of each of the plurality of MR elements 50B included in the resistor section R4 increase. As a result, the resistance values of the resistor sections R1 and R3 decrease, and the resistance values of the resistor sections R2 and R4 increase.

When there exists the first magnetic field component Hz in the –Z direction, the direction of the output magnetic field component and the changes in the resistance values of the resistor sections R1 to R4 are opposite from those in the above-described case where the first magnetic field component Hz is in the Z direction.

The amount of change in the resistance value of each of the resistor sections R1 to R4 depends on the strength of the output magnetic field component received by each of the plurality of MR elements 50A and the plurality of MR elements 50B. The resistance value of each of the resistor sections R1 to R4 increases or decreases by a larger amount as the strength of the output magnetic field component increases. The resistance value of each of the resistor sections R1 to R4 increases or decreases by a smaller amount as the strength of the output magnetic field component decreases. The strength of the output magnetic field component depends on the strength of the first magnetic field component Hz.

As described above, changes in the direction and strength of the first magnetic field component Hz cause the resistance value of each of the resistor sections R1 to R4 to change such that the resistance value of each of the resistor sections R1 and R3 increases while the resistance value of each of the resistor sections R2 and R4 decreases, or such that the resistance value of each of the resistor sections R1 and R3 decreases while the resistance value of each of the resistor sections R2 and R4 increases. With this, the potential of the connection point of the resistor sections R1 and R2, i.e., the potential of the first output terminal 13 and the potential of the connection point of the resistor sections R3 and R4, i.e., the potential of the second output terminal 14 change. The magnetic sensor 1 may generate, as detection signals, a signal corresponding to the potential of the first output terminal 13 and a signal corresponding to the potential of the second output terminal 14. Alternatively, the magnetic sensor 1 may generate, as a detection signal, a signal corresponding to the potential difference between the first and second output terminals 13 and 14. In such a case, the magnetic sensor 1 may further include a differential amplifier (difference detector) that outputs, as a detection signal, the signal corresponding to the potential difference between the first and second output terminals 13 and 14.

The magnetic sensor system 100 may further include a processor (not shown). The processor (not shown) may be configured to generate, when receiving one detection signal or two detection signals output by the magnetic sensor 1, a detection value having a correspondence with the strength of the first magnetic field component Hz or a detection value having a correspondence with the position of the magnetic field generation unit 5 (see FIG. 1). For example, the processor (not shown) is constructed of an application-specific integrated circuit (ASIC).

Figure 8:
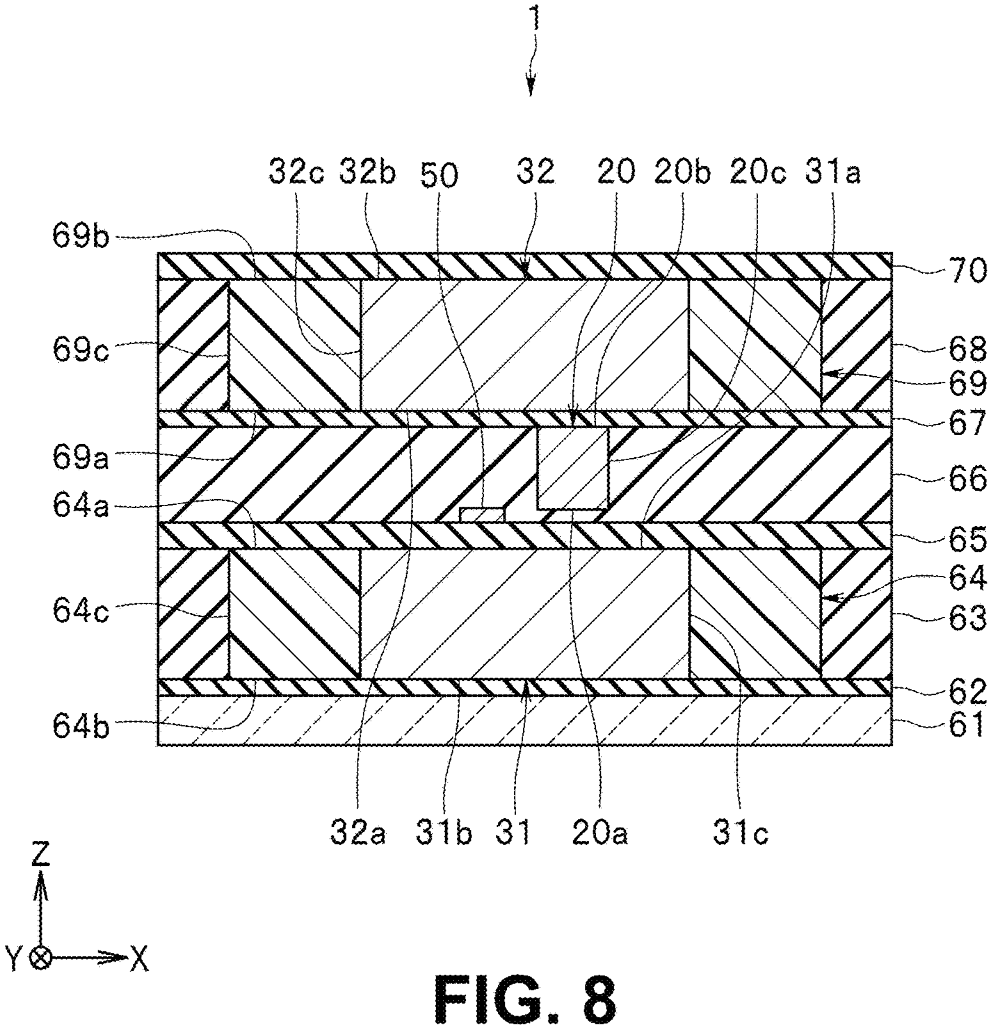
FIG. 8 is a sectional view showing the magnetic sensor according to the first example embodiment of the technology.
Figure 9:
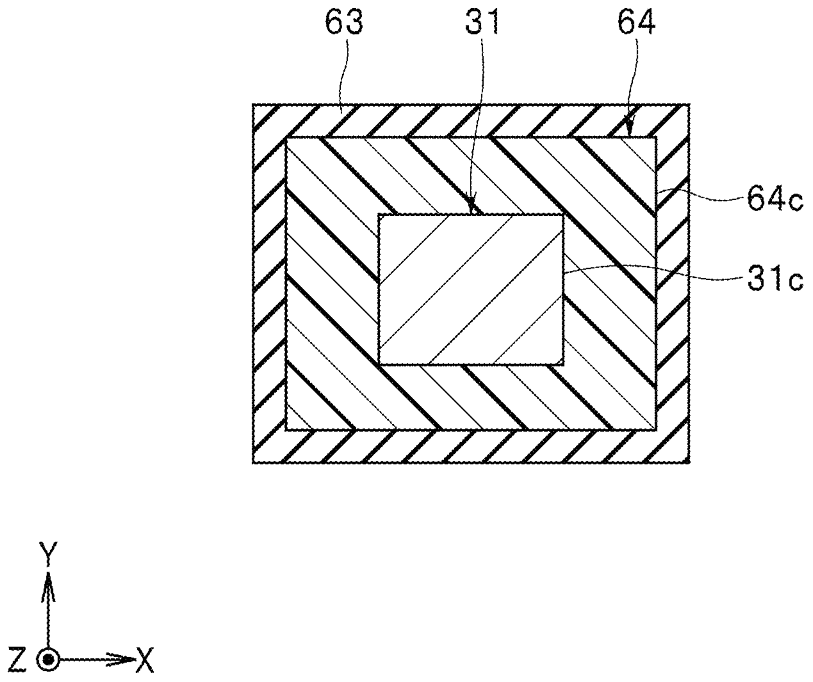
FIG. 9 is a sectional view showing the magnetic sensor according to the first example embodiment of the technology.
Figure 10:
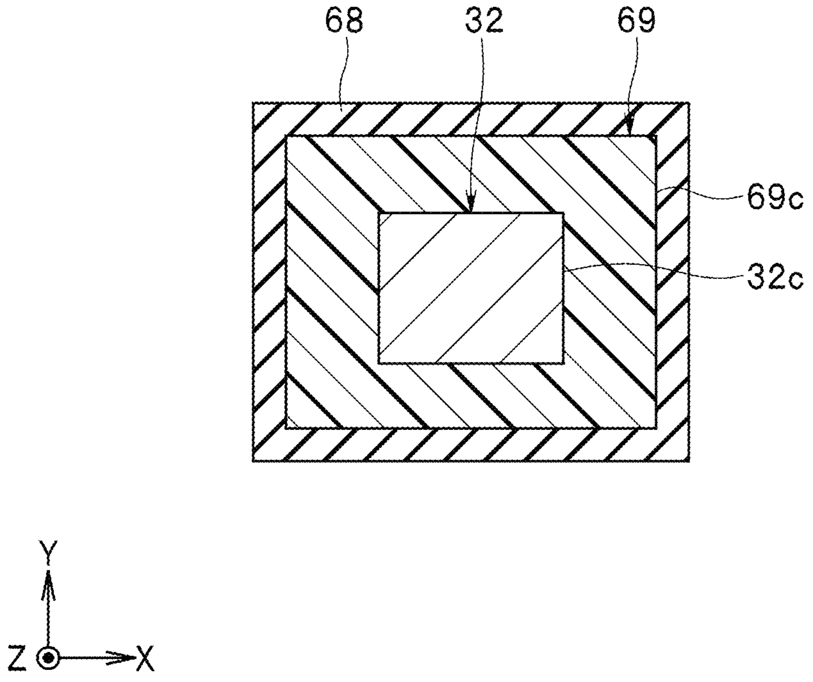
FIG. 10 is a sectional view showing the magnetic sensor according to the first example embodiment of the technology.

Next, structural features of the magnetic sensor 1 according to the example embodiment will be described with reference to FIGS. 8 to 10. FIGS. 8 to 10 are each a sectional view showing the magnetic sensor 1. Note that FIG. 8 shows a cross section of the magnetic sensor 1 parallel to an XZ plane. FIG. 9 shows a cross section of the magnetic sensor 1 that is parallel to an XY plane and that intersects the magnetic shield 31. FIG. 10 shows a cross section of the magnetic sensor 1 that is parallel to the XY plane and that intersects the magnetic shield 32.

Note that, in FIGS. 8 to 10, the magnetic sensor 1 is shown in a simplified form for the sake of convenience. In particular, in FIGS. 8 to 10, on behalf of the plurality of MR elements 50 and the plurality of yokes 20, one MR element 50 and one yoke 20 are shown.

The magnetic sensor 1 includes a substrate 61 and an insulating layer 62 disposed on the substrate 61. The insulating layer 62 is formed of $Al_2O_3$, for example. The magnetic shield 31 is disposed on the insulating layer 62.

The magnetic sensor 1 further includes a surrounding layer 64 disposed, on the insulating layer 62, around the magnetic shield 31, and an insulating layer 63 disposed, on the insulating layer 62, around the surrounding layer 64. The insulating layer 63 is formed of $SiO_2$, for example. The surrounding layer 64 is formed of an organic material or a glass material. As the organic material, for example, a photoresist or a polyimide is used. As the glass material, for example, a spin-on glass (SOG) is used.

The magnetic sensor 1 further includes an insulating film 65 disposed covering the magnetic shield 31, the insulating layer 63, and the surrounding layer 64. The insulating film 65 is formed of $SiO_2$ or $Al_2O_3$, for example. The plurality of MR elements 50 and the wiring portion 40 (see FIG. 2) are disposed on the insulating film 65.

The magnetic sensor 1 further includes an insulating layer 66 disposed covering the plurality of MR elements 50 and the wiring portion 40. The insulating layer 66 is formed of $SiO_2$ or $Al_2O_3$, for example. The plurality of yokes 20 are embedded in the insulating layer 66.

The magnetic sensor 1 further includes an insulating film 67 disposed covering the plurality of yokes 20 and the insulating layer 66. The insulating film 67 is formed of $SiO_2$ or $Al_2O_3$, for example. The magnetic shield 32 is disposed on the insulating film 67.

The magnetic sensor 1 further includes a surrounding layer 69 disposed, on the insulating film 67, around the magnetic shield 32, and an insulating layer 68 disposed, on the insulating film 67, around the surrounding layer 69. The insulating layer 68 is formed of $SiO_2$, for example. The surrounding layer 69 is, similarly to the surrounding layer 64, formed of an organic material or a glass material.

The magnetic sensor 1 further includes an insulating film 70 disposed covering the magnetic shield 32, the insulating layer 68, and the surrounding layer 69. The insulating film 70 is formed of $SiO_2$ or $Al_2O_3$, for example.

Features related to the magnetic shield 31 and the surrounding layer 64 will be described with reference to FIGS. 8 and 9. The magnetic shield 31 has a first surface 31*a* and a second surface 31*b* located opposite to each other in the direction parallel to the Z direction, and a side surface 31*c* connecting the first surface 31*a* and the second surface 31*b*. The first surface 31*a* is located at the end in the Z direction of the magnetic shield 31. The second surface 31*b* is located at the end in the −Z direction of the magnetic shield 31. The direction parallel to the Z direction corresponds to a "reference direction" in the technology.

The magnetic shield 31 includes one magnetic layer. No nonmagnetic layer is provided between the first surface 31*a* and the second surface 31*b* of the magnetic shield 31.

The surrounding layer 64 is disposed entirely covering the side surface 31*c* of the magnetic shield 31. The dimension of the surrounding layer 64 in the direction parallel to the Z direction is the same or substantially the same as the dimension of the magnetic shield 31 in the direction parallel to the Z direction. The surrounding layer 64 has a third surface 64*a* and a fourth surface 64*b* located opposite to each other in the direction parallel to the Z direction, and an outer peripheral surface 64*c* connecting the third surface 64*a* and the fourth surface 64*b*. The third surface 64*a* is located at the end in the Z direction of the surrounding layer 64. The fourth surface 64*b* is located at the end in the −Z direction of the surrounding layer 64. The insulating layer 63 has a frame-like shape when seen in the Z direction and is disposed entirely covering the outer peripheral surface 64*c* of the surrounding layer 64.

The plurality of MR elements 50 are each disposed at a position closer to the first surface 31*a* of the magnetic shield 31 than the second surface 31*b* of the magnetic shield 31. In the direction parallel to the Z direction, the surrounding layer 64 is not provided between the first surface 31*a* of the magnetic shield 31 and the plurality of MR elements 50. In the direction parallel to the Z direction, the surrounding layer 64 is not provided at a position facing the first surface 31*a* of the magnetic shield 31. In the direction parallel to the Z direction, the surrounding layer 64 is not provided at a position facing the second surface 31*b* of the magnetic shield 31.

The plurality of MR elements 50 each overlap, when seen in the Z direction, with the magnetic shield 31 but not with the surrounding layer 64.

Next, features related to the magnetic shield 32 and the surrounding layer 69 will be described with reference to FIGS. 8 and 10. The magnetic shield 32 has a first surface 32*a* and a second surface 32*b* located opposite to each other in the direction parallel to the Z direction, and a side surface 32*c* connecting the first surface 32*a* and the second surface 32*b*. The first surface 32*a* is located at the end in the −Z direction of the magnetic shield 32. The second surface 32*b* is located at the end in the Z direction of the magnetic shield 32.

The magnetic shield 32 includes one magnetic layer. No nonmagnetic layer is provided between the first surface 32*a* and the second surface 32*b* of the magnetic shield 32.

The surrounding layer 69 is disposed entirely covering the side surface 32*c* of the magnetic shield 32. The dimension of the surrounding layer 69 in the direction parallel to the Z direction is the same or substantially the same as the dimension of the magnetic shield 32 in the direction parallel to the Z direction. The surrounding layer 69 has a third surface 69*a* and a fourth surface 69*b* located opposite to each other in the direction parallel to the Z direction, and an outer peripheral surface 69*c* connecting the third surface 69*a* and the fourth surface 69*b*. The third surface 69*a* is located at the end in the −Z direction of the surrounding layer 69. The fourth surface 69*b* is located at the end in the Z direction of the surrounding layer 69. The insulating layer 68 has a frame-like shape when seen in the Z direction and is disposed entirely covering the outer peripheral surface 69*c* of the surrounding layer 69.

The plurality of MR elements 50 are each disposed at a position closer to the first surface 32*a* of the magnetic shield 32 than the second surface 32*b* of the magnetic shield 32. In the direction parallel to the Z direction, the surrounding layer 69 is not provided between the first surface 32*a* of the magnetic shield 32 and the plurality of MR elements 50. In the direction parallel to the Z direction, the surrounding layer 69 is not provided at a position facing the first surface 32*a* of the magnetic shield 32. In the direction parallel to the Z direction, the surrounding layer 69 is not provided at a position facing the second surface 32*b* of the magnetic shield 32.

The plurality of MR elements 50 each overlap, when seen in the Z direction, with the magnetic shield 32 but not with the surrounding layer 69.

Next, features related to the plurality of yokes 20 will be described with reference to FIG. 8. Each of the plurality of yokes 20 has a first surface 20*a* and a second surface 20*b* located opposite to each other in the direction parallel to the Z direction, and a side surface 20*c* connecting the first surface 20*a* and the second surface 20*b*. The first surface 20*a* is located at the end in the −Z direction of each yoke 20. The second surface 20*b* is located at the end in the Z direction of the yoke 20. The first and second side surfaces 20*c*1 and 20*c*2 shown in FIG. 5 are part of the side surface 20*c*.

Each of the plurality of yokes 20 includes one magnetic layer. No nonmagnetic layer is provided between the first surface 20*a* and the second surface 20*b* of each of the plurality of yokes 20.

Each of the plurality of MR elements 50 is disposed at a position closer to the first surface 20*a* of a corresponding one yoke 20 of the plurality of yokes 20 than the second surface 20*b* of the one yoke 20. At least a part of each of the plurality of MR elements 50 does not overlap, when seen in the Z direction, with a corresponding one yoke 20 of the plurality of yokes 20. In the example shown in FIG. 8, each of the plurality of MR elements 50 does not overlap, when seen in the Z direction, with a corresponding one yoke 20 of the plurality of yokes 20 at all.

Next, a manufacturing method for the magnetic sensor 1 according to the example embodiment will be described. The manufacturing method for the magnetic sensor 1 includes a step of forming, on the substrate 61, the components other than the substrate 61 for a plurality of the magnetic sensors 1 to manufacture a base structure on which a plurality of rows of sensor-to-be portions to later become the magnetic sensors 1 are arranged, and a step of cutting the base structure to separate the plurality of sensor-to-be portions from each other. As described above, the plurality of magnetic sensors 1 are manufactured. In the manufacturing method for the magnetic sensor 1, a wafer is used as the substrate 61. The wafer includes a portion to become the substrate 61 for the plurality of magnetic sensors 1.

Hereinafter, focusing on one magnetic sensor 1, the manufacturing method for the magnetic sensor 1 according to the example embodiment will be described further in detail. FIGS. 11 to 19 each show a sectional view in manufacturing of the magnetic sensor 1.

Figure 11:
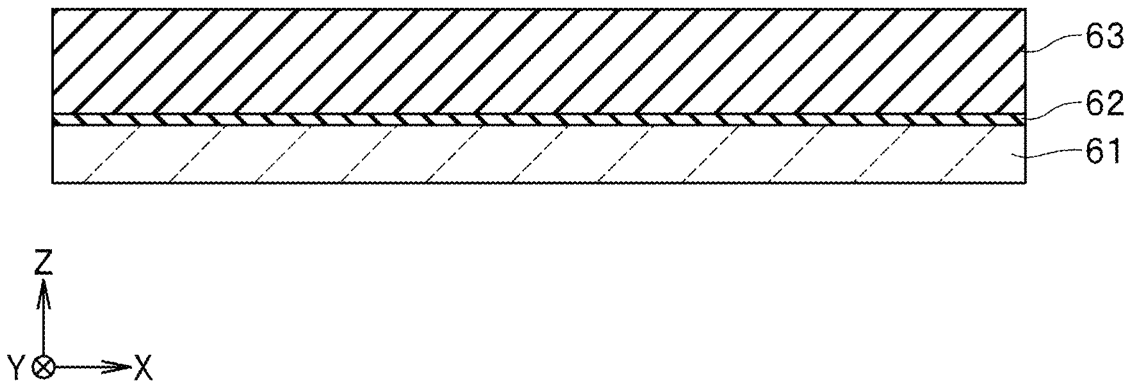
FIG. 11 is a sectional view showing a step in a manufacturing method for the magnetic sensor of the first example embodiment of the technology.

In the manufacturing method for the magnetic sensor 1, first, the insulating layers 62 and 63 are formed in this order on the substrate 61, as shown in FIG. 11.

Figure 12:
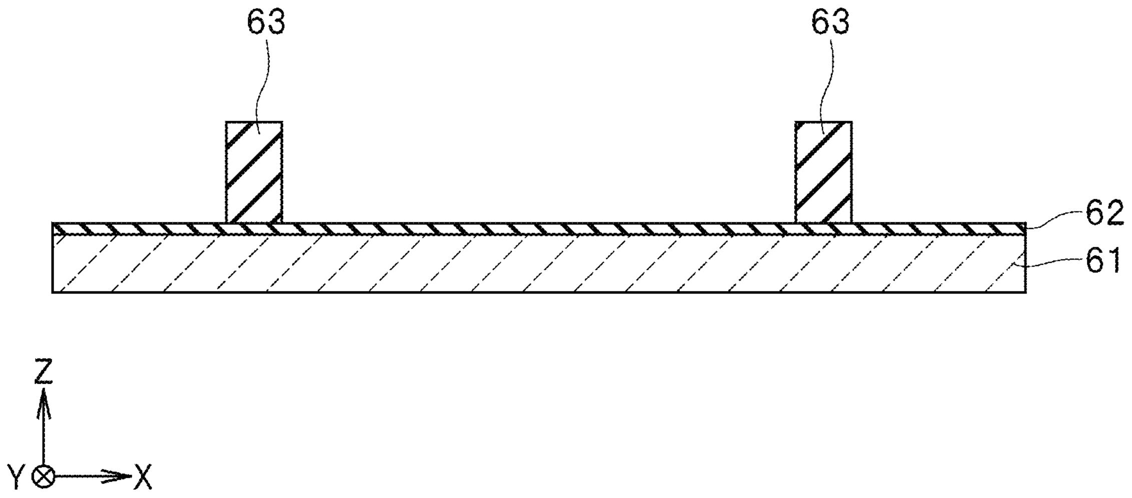
FIG. 12 is a sectional view showing a step that follows the step shown in FIG. 11.

FIG. 12 shows the next step. In this step, the insulating layer 63 is etched by, for example, reactive ion etching (hereinafter, referred to as RIE). In a case where the insulating layer 62 and the insulating layer 63 are formed of respective materials different from each other, the insulating layer 63 may be etched using the insulating layer 62 as an etching stopper. For example, in a case where the insulating layer 63 is formed of $SiO_2$, the insulating layer 62 is formed of $Al_2O_3$ so that the insulating layer 62 can be used as an etching stopper.

Figure 13:
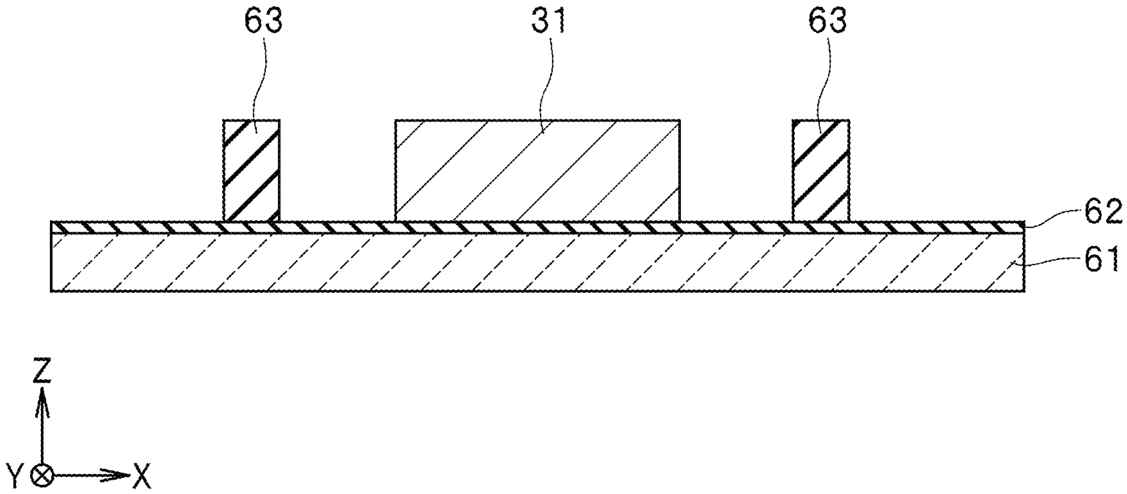
FIG. 13 is a sectional view showing a step that follows the step shown in FIG. 12.

FIG. 13 shows the next step. In this step, first, a seed layer (not shown) is formed. Next, using the seed layer as a seed and electrode, the magnetic shield 31 is formed by plating. A part, of the seed layer (not shown), not covered with the magnetic shield 31 is then removed.

Figure 14:
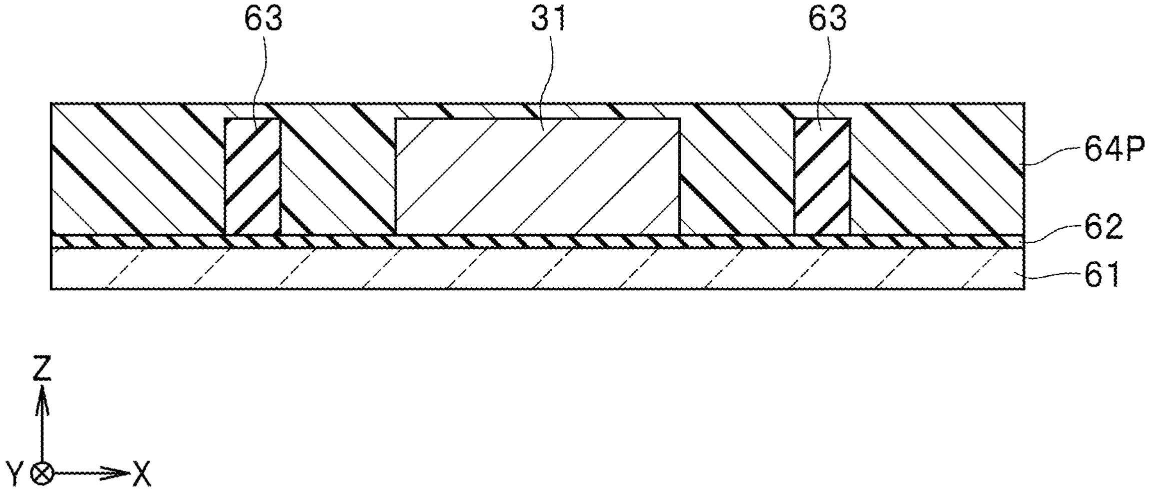
FIG. 14 is a sectional view showing a step that follows the step shown in FIG. 13.

FIG. 14 shows the next step. In this step, a material layer 64P to later serve as the surrounding layer 64 is formed. The material layer 64P is formed by applying a material with fluidity over the entire top surface of the stack and heating and curing the material. The top surface of the material layer 64P is flat or substantially flat.

Figure 15:
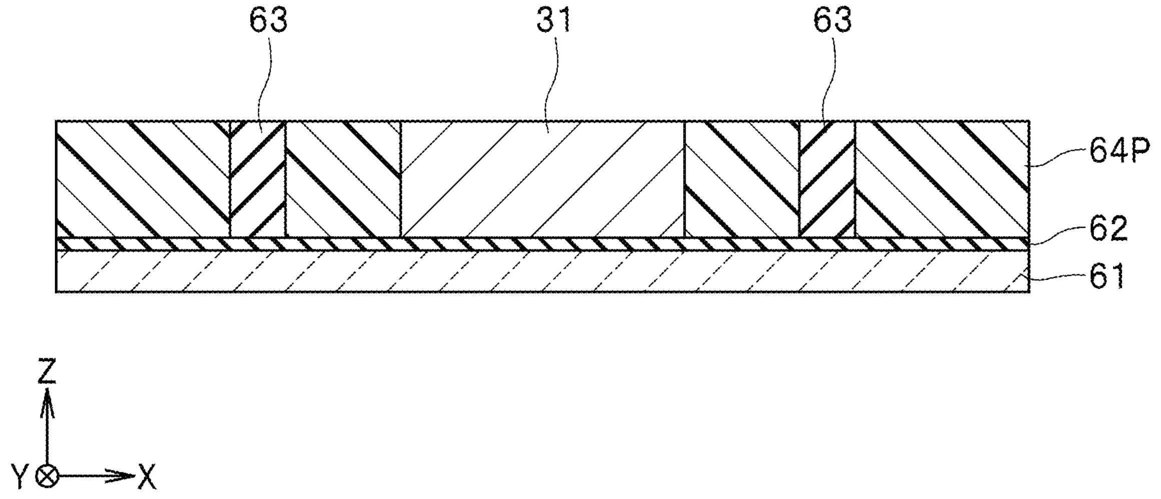
FIG. 15 is a sectional view showing a step that follows the step shown in FIG. 14.

FIG. 15 shows the next step. In this step, a part of the material layer 64P is removed to expose the front of the magnetic shield 31 and the insulating layer 63. Note that, in a case where the material layer 64P is formed of a photoresist, the part of the material layer 64P may be removed by ashing and then annealing treatment may be performed. The annealing treatment allows dishing of the material layer 64P caused by ashing to be flattened.

Figure 16:
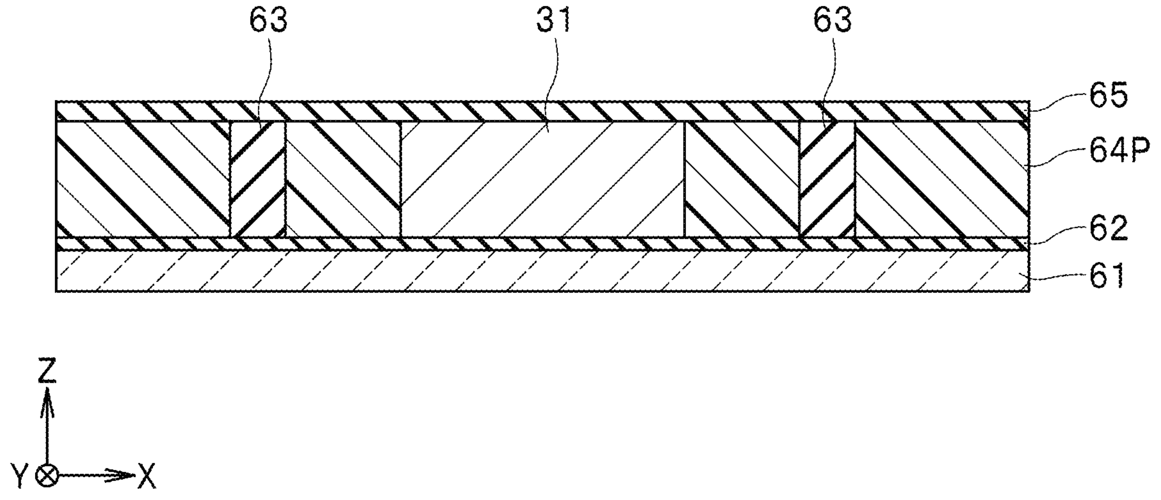
FIG. 16 is a sectional view showing a step that follows the step shown in FIG. 15.

FIG. 16 shows the next step. In this step, the insulating film 65 is formed on the magnetic shield 31, the insulating layer 63, and the material layer 64P.

Figure 17:
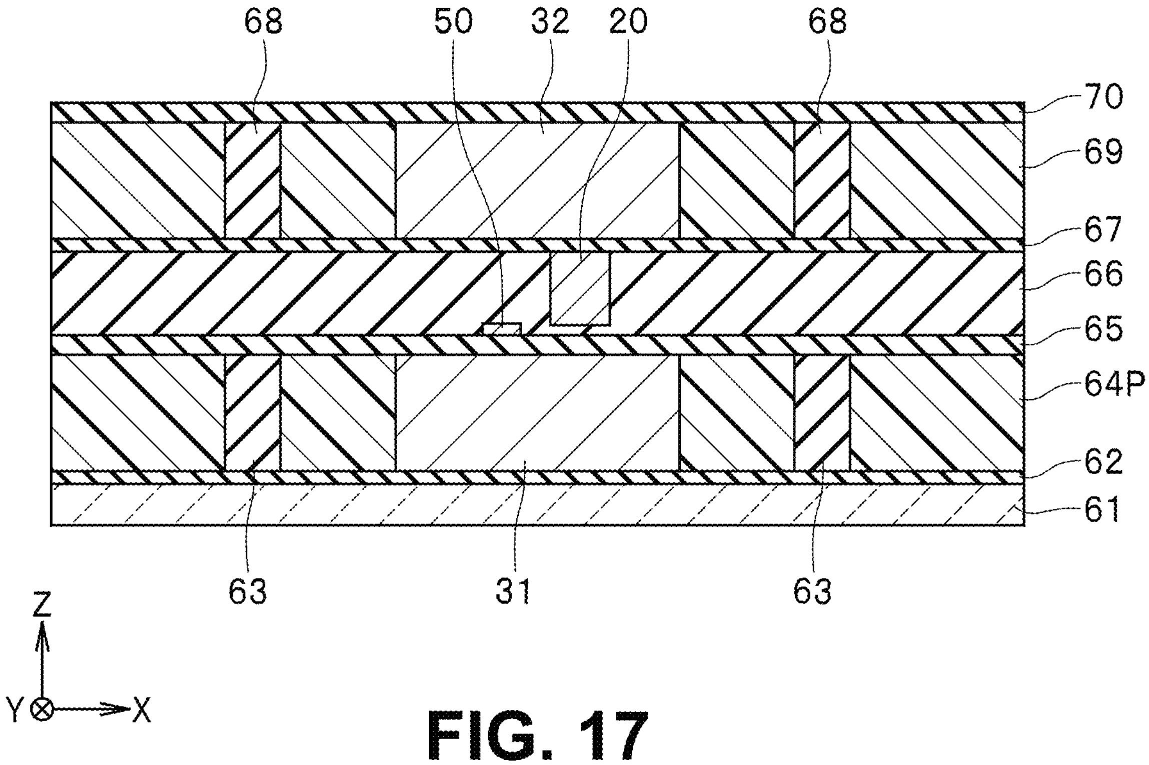
FIG. 17 is a sectional view showing a step that follows the step shown in FIG. 16.

FIG. 17 shows the next step. In this step, first, the plurality of MR elements 50, the wiring portion 40 (not shown), the plurality of yokes 20, and the insulating layer 66 are formed on the insulating film 65. The insulating film 67 is then formed on the plurality of yokes 20 and the insulating layer 66.

Next, the magnetic shield 32 and the insulating layer 68, and a material layer 69P to later serve as the surrounding layer 69 are formed on the insulating film 67. The method of forming the magnetic shield 32, the insulating layer 68, and the material layer 69P is similar to the method of forming the magnetic shield 31, the insulating layer 63, and the material layer 64P. The insulating film 70 is then formed on the magnetic shield 32, the insulating layer 68, and the material layer 69P.

Figure 18:
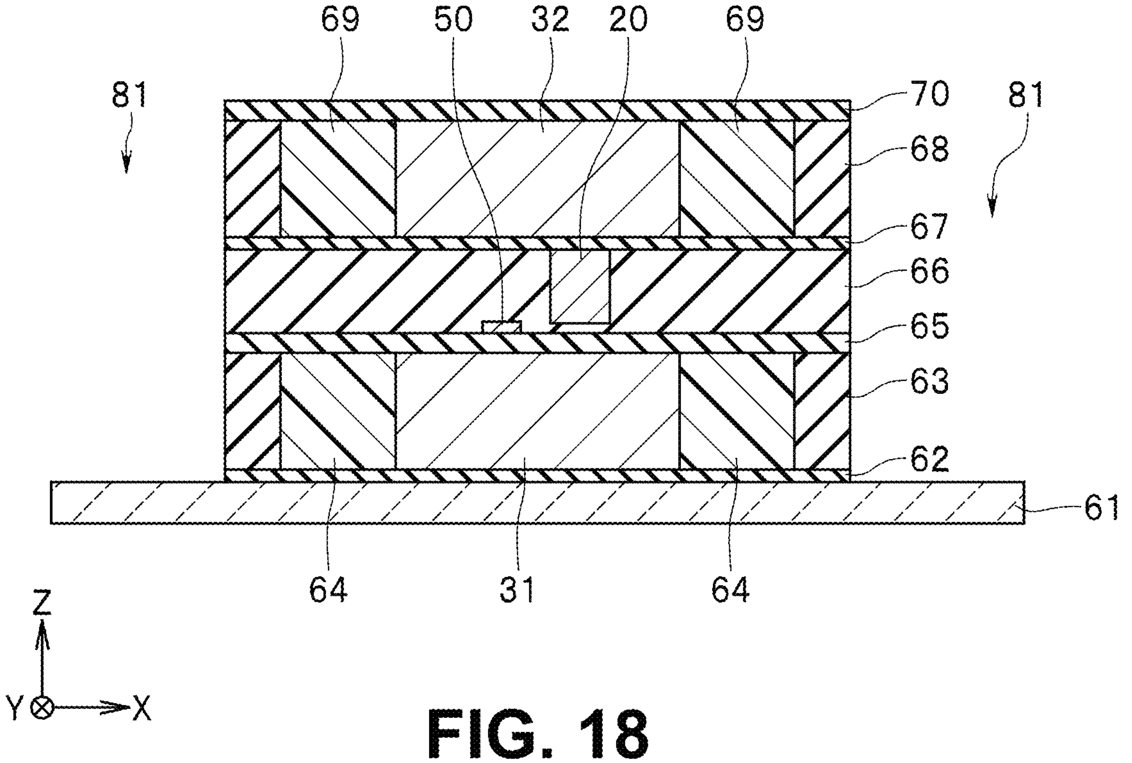
FIG. 18 is a sectional view showing a step that follows the step shown in FIG. 17.
Figure 19:
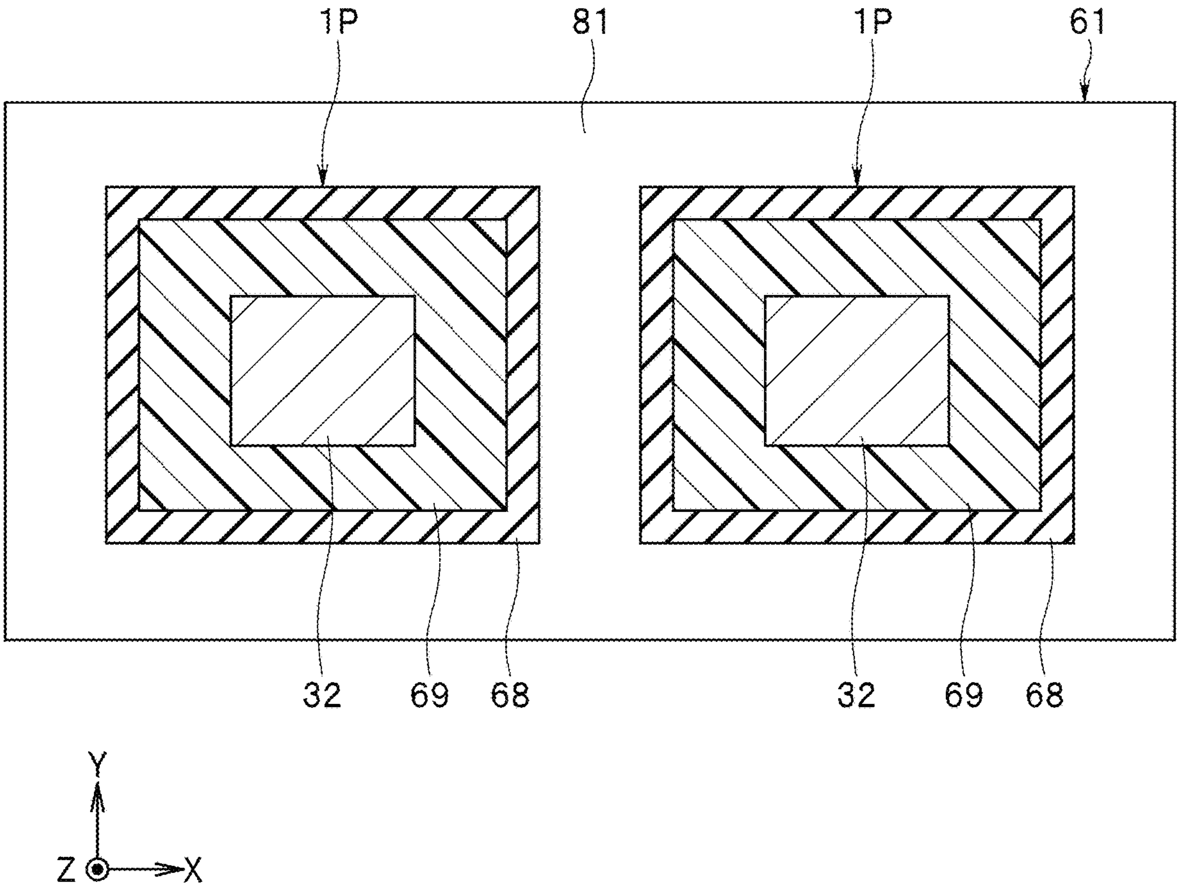
FIG. 19 is a plan view showing a step that follows the step shown in FIG. 17.

FIGS. 18 and 19 show the next step. In FIG. 19, the reference numeral "1P" denotes sensor-to-be portions to later become the magnetic sensors 1. In the manufacturing method for the magnetic sensor 1, a plurality of the sensor-to-be portions 1P are formed. In FIG. 19, two sensor-to-be portions 1P are shown. In a step shown in FIGS. 18 and 19, a scribe line 81 is formed between the two adjoining sensor-to-be portions 1P. The scribe line 81 is formed by removing the insulating layers 62 and 66, the insulating films 65, 67, and 70, and the material layers 64P and 69P located between the two adjoining sensor-to-be portions 1P by etching. A part, of the material layer 64P, left after the etching is the surrounding layer 64. A part, of the material layer 69P, left after the etching is the surrounding layer 69. The etching of the insulating layer 66 is performed by using RIE, for example.

The substrate 61 is then cut along the scribe line 81 to complete the plurality of magnetic sensors 1.

Next, the operation and effects of the magnetic sensor 1 according to the example embodiment will be described. In the example embodiment, the surrounding layer 64 is disposed entirely covering the side surface 31*c* of the magnetic shield 31. The surrounding layer 64 is formed of an organic material or a glass material that has hardness lower than that of an inorganic insulating material such as $Al_2O_3$ or $SiO_2$, i.e., that is soft. In a case where an insulating layer formed of an inorganic insulating material is disposed entirely covering the side surface 31*c* of the magnetic shield 31, when the thickness being the dimension of the magnetic shield 31 in the direction parallel to the Z direction is made larger, the thickness of the insulating layer is also made larger, so that it is likely to cause a crack in the insulating layer in the manufacturing process. In order for this to be prevented, it is conceivable that the magnetic shield 31 having a relatively small thickness is formed a plurality of times. This has, however, a problem in that the number of steps is increased, causing a high cost for manufacturing the magnetic sensor 1.

In contrast, the example embodiment uses the surrounding layer 64 that is soft as compared to an insulating layer formed of an inorganic insulating material. With this, according to the example embodiment, the magnetic shield 31 having a relatively large thickness can be formed in one step, allowing the number of steps to be decreased and the cost for manufacturing the magnetic sensor 1 to be reduced.

In a case where the magnetic shield 31 is formed in a plurality of times, a step of forming a magnetic layer included in a part of the magnetic shield 31, a step of forming an insulating layer covering the magnetic layer, and a step of polishing to flatten the insulating layer are each performed a plurality of times. As described above, in the manufacturing method for the magnetic sensor 1, a wafer including a part to become the substrate 61 for the plurality of magnetic sensors 1 is used. In general, the amount of polishing of an insulating layer at the center of a wafer is different from the amount of polishing of the insulating layer near the outer periphery. Thus, in the case where the magnetic shield 31 is formed in a plurality of times, the thickness of an insulating layer of the magnetic sensor 1 formed near the center of the wafer is different from the thickness of the insulating layer of the magnetic sensor 1 formed near the outer periphery of the wafer. This results in variations in the shapes of the base parts for the plurality of MR elements 50.

In contrast, according to the example embodiment, the magnetic shield 31 can be formed in one step, allowing variations in the shapes of the base parts for the plurality of MR elements 50 to be suppressed.

In the example embodiment, the material layer 64P formed of an organic material or a glass material softer than an inorganic insulating material is disposed in a region where the scribe line 81 is to be formed. As compared to an insulating layer formed of an inorganic insulating material, the material layer 64P can be removed easily in a short time. In particular, in a case where the material layer 64P is formed of a photoresist and the material layer 64P is removed by, instead of RIE, plasma etching using $O_2$ gas, occurrence of any residue or re-sticking film can be suppressed as compared to a case of removing an insulating layer by RIE. With this, the example embodiment allows the lead time for the magnetic sensor 1 to be shortened and the cost for manufacturing the magnetic sensor 1 to be reduced.

The foregoing description of the magnetic shield 31 and the surrounding layer 64 also applies to the magnetic shield 32 and the surrounding layer 69.

Second Example Embodiment

Figure 20:
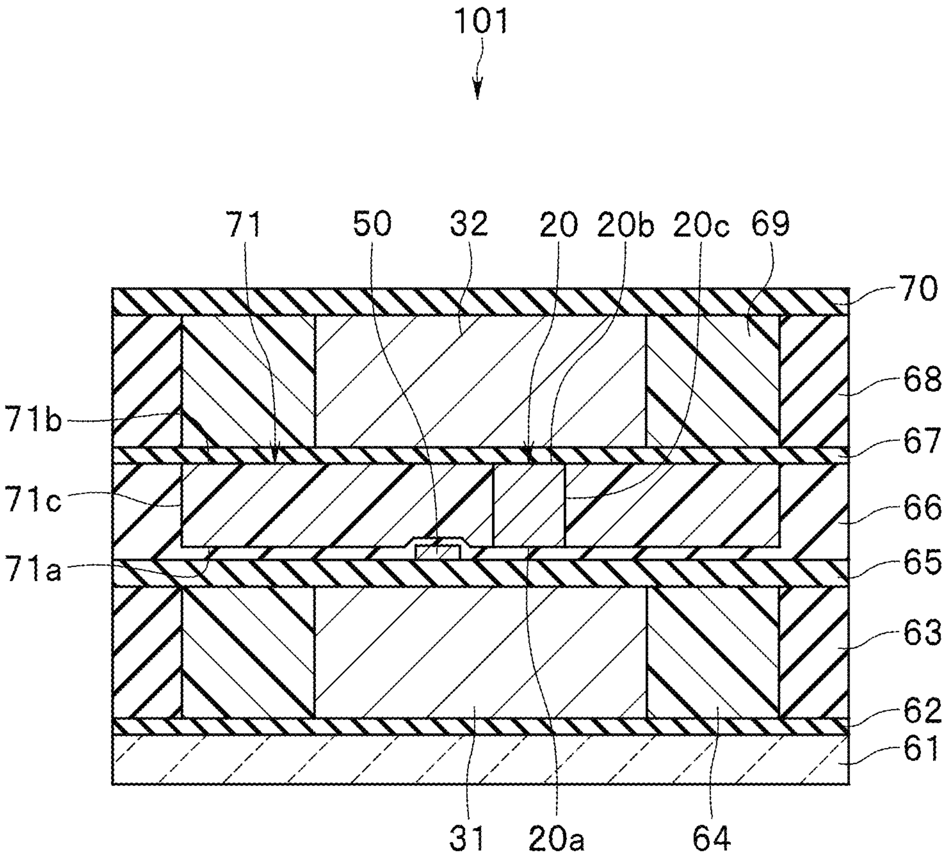
FIG. 20 is a sectional view showing a magnetic sensor according to a second example embodiment of the technology.

A second example embodiment of the technology will now be described with reference to FIG. 20. FIG. 20 is a sectional view showing a magnetic sensor according to the example embodiment. Note that, in FIG. 20, the magnetic sensor is shown in a simplified form for the sake of convenience. In particular, in FIG. 20, on behalf of the plurality of MR elements 50 and the plurality of yokes 20, one MR element 50 and one yoke 20 are shown.

A configuration of a magnetic sensor 101 according to the example embodiment is different from the configuration of the magnetic sensor 1 according to the first example embodiment in the following. The magnetic sensor 101 includes, in addition to the components of the magnetic sensor 1, a surrounding layer 71. The surrounding layer 71 is disposed around the plurality of yokes 20. The surrounding layer 71 is embedded in the insulating layer 66. The surrounding layer 71 is, similarly to the surrounding layers 64 and 69, formed of an organic material or a glass material.

The surrounding layer 71 is disposed entirely covering the side surface 20*c* of each of the plurality of yokes 20. The dimension of the surrounding layer 71 in the direction parallel to the Z direction is the same or substantially the same as the dimension of each of the plurality of yokes 20 in the direction parallel to the Z direction. The surrounding layer 71 has a third surface 71*a* and a fourth surface 71*b* located opposite to each other in the direction parallel to the Z direction, and an outer peripheral surface 71*c* connecting the third surface 71*a* and the fourth surface 71*b*. The third surface 71*a* is located at the end in the −Z direction of the surrounding layer 71. The fourth surface 71*b* is located at the end in the Z direction of the surrounding layer 71. The outer peripheral surface 71*c* is entirely covered with the insulating layer 66.

In the direction parallel to the Z direction, the surrounding layer 71 is not provided between the first surface 20*a* of each of the plurality of yokes 20 and the plurality of MR elements 50. In the direction parallel to the Z direction, the surrounding layer 71 is not provided at a position facing the first surface 20*a* of each of the plurality of yokes 20. In the direction parallel to the Z direction, the surrounding layer 71 is not provided at a position facing the second surface 20*b* of each of the plurality of yokes 20. The plurality of MR elements 50 each overlap, when seen in the Z direction, with the surrounding layer 71.

For a reason the same as the reason described in the first example embodiment regarding the magnetic shield 31 and the surrounding layer 64, the example embodiment allows the cost for manufacturing the magnetic sensor 101 to be reduced, with the thickness of each of the plurality of yokes 20 made large.

Meanwhile, the ratio of the thickness of each yoke 20 to the dimension of the yoke 20 in the direction parallel to the X direction is higher than the ratio of the thickness of the magnetic shield 31 to the dimension of the magnetic shield 31 in the direction parallel to the X direction. In the magnetic sensor 1, the yoke 20 may be desired to have the foregoing ratio higher in some cases. In a case where the yoke 20 is formed in a plurality of times, the dimension of the yoke 20 in the direction parallel to the X direction is to be made large, taking account of a margin for position displacement of a plurality of magnetic layers included in the yoke 20. In contrast, according to the example embodiment, the yoke 20 can be formed in one step, allowing the yoke 20 to have the foregoing ratio made high, without making the dimension of the yoke 20 in the direction parallel to the X direction large.

The configuration, operation and effects of the present example embodiment are otherwise the same as those of the first example embodiment.

Third Example Embodiment

Figure 21:
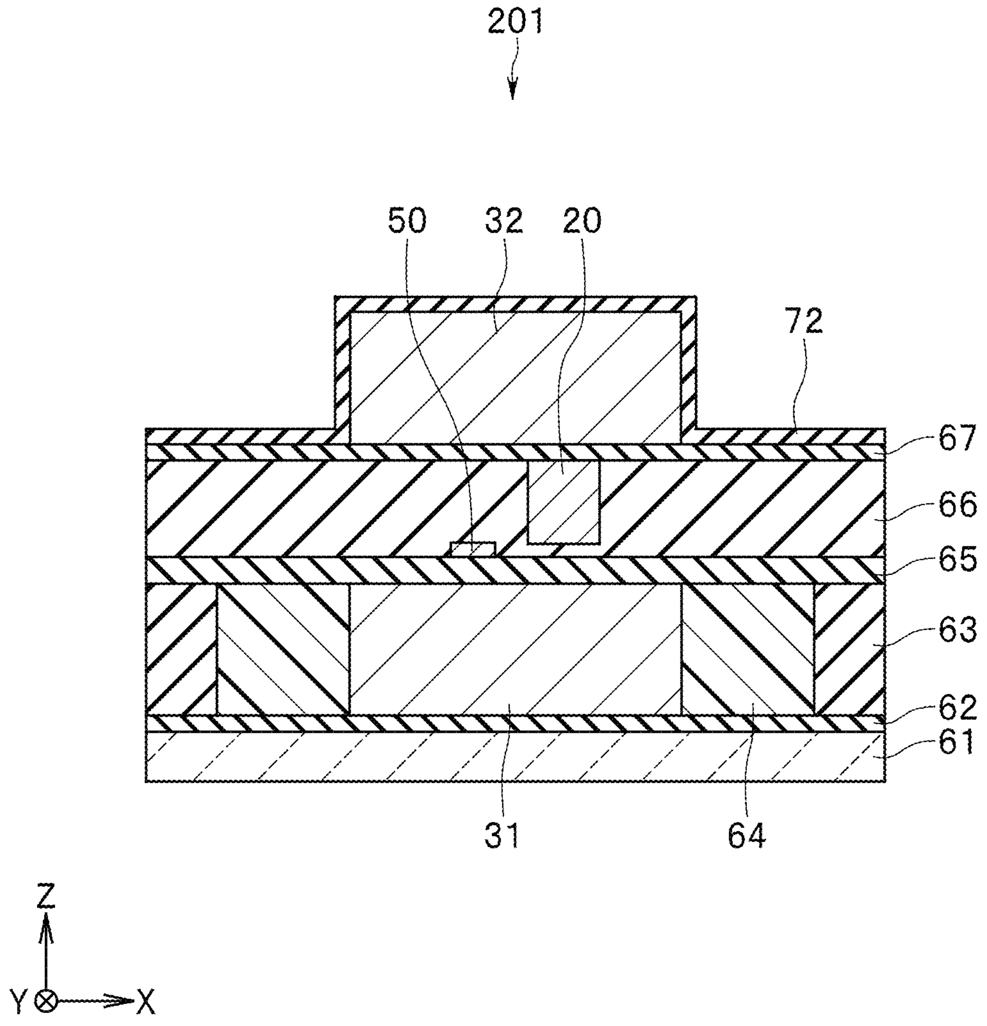
FIG. 21 is a sectional view showing a magnetic sensor according to a third example embodiment of the technology.

A third example embodiment of the technology will now be described with reference to FIG. 21. FIG. 21 is a sectional view showing a magnetic sensor according to the example embodiment. Note that, in FIG. 21, the magnetic sensor is shown in a simplified form for the sake of convenience. In particular, in FIG. 21, on behalf of the plurality of MR elements 50 and the plurality of yokes 20, one MR element 50 and one yoke 20 are shown.

A configuration of a magnetic sensor 201 according to the example embodiment is different from the configuration of the magnetic sensor 1 according to the first example embodiment in the following. The magnetic sensor 201 includes an insulating film 72, instead of the insulating layer 68, the surrounding layer 69, and the insulating film 70 of the first example embodiment. The insulating film 72 is disposed, covering the magnetic shield 32 and the insulating film 67, along surfaces of the magnetic shield 32 and the insulating film 67.

The configuration, operation and effects of the present example embodiment are otherwise the same as those of the first example embodiment.

Fourth Example Embodiment

Figure 22:
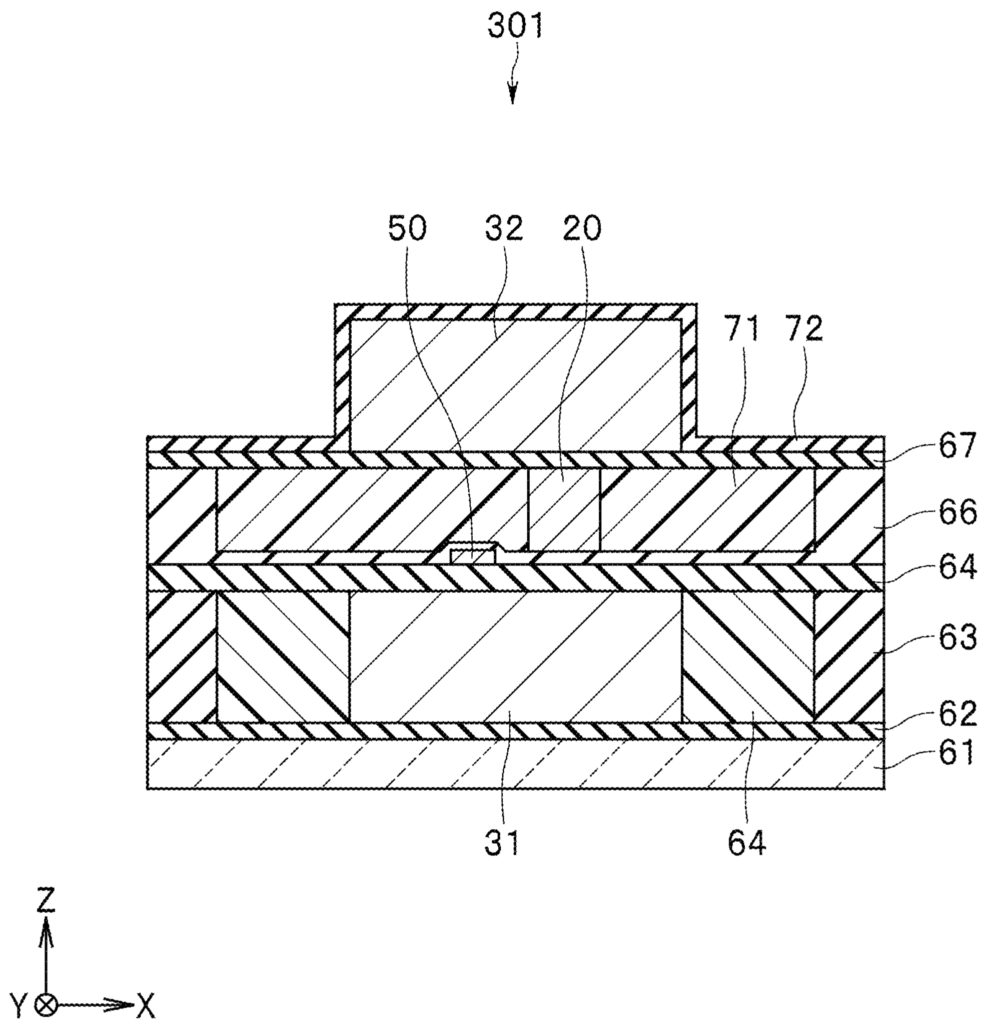
FIG. 22 is a sectional view showing a magnetic sensor according to a fourth example embodiment of the technology.

A fourth example embodiment of the technology will now be described with reference to FIG. 22. FIG. 22 is a sectional view showing a magnetic sensor according to the example embodiment. Note that, in FIG. 22, the magnetic sensor is shown in a simplified form for the sake of convenience. In particular, in FIG. 22, on behalf of the plurality of MR elements 50 and the plurality of yokes 20, one MR element 50 and one yoke 20 are shown.

A configuration of a magnetic sensor 301 according to the example embodiment is different from the configuration of the magnetic sensor 101 according to the second example embodiment in the following. The magnetic sensor 301 includes an insulating film 72 of the third example embodiment, instead of the insulating layer 68, the surrounding layer 69, and the insulating film 70 of the second example embodiment. The insulating film 72 is disposed, covering the magnetic shield 32 and the insulating film 67, along surfaces of the magnetic shield 32 and the insulating film 67.

The configuration, operation and effects of the present example embodiment are otherwise the same as those of the second or third example embodiment.

The technology is not limited to the foregoing example embodiments, and various modifications may be made thereto. For example, each of the magnetic shield 31 and the magnetic shield 32 may include a plurality of magnetic layers separated from each other. Either one of the magnetic shield 31 or the magnetic shield 32 may not be provided.

The magnetic sensor according to the technology may be used for a magnetic compass using a target magnetic field as a geomagnetic field. The magnetic compass may include, besides the magnetic sensor according to the technology, a magnetic sensor that detects a magnetic field in the direction parallel to the X direction and a magnetic sensor that detects a magnetic field in the direction parallel to the Y direction.

As described above, a magnetic sensor according to an embodiment of the technology includes: at least one magnetic detection element configured to detect a target magnetic field; a magnetic layer having a first surface and a second surface located opposite to each other in a reference direction and a side surface connecting the first surface and the second surface; and a surrounding layer that is formed of an organic material or a glass material and that is disposed entirely covering the side surface of the magnetic layer. The at least one magnetic detection element is disposed at a position closer to the first surface than the second surface. The surrounding layer is not provided between the first surface of the magnetic layer and the at least one magnetic detection element in the reference direction.

In the magnetic sensor according to an embodiment of the technology, the surrounding layer may not need to be provided at a position facing the second surface of the magnetic layer in the reference direction.

In the magnetic sensor according to an embodiment of the technology, the at least one magnetic detection element may overlap, when seen in the reference direction, with the magnetic layer but not with the surrounding layer. The magnetic layer may be a magnetic shield.

In the magnetic sensor according to an embodiment of the technology, the at least one magnetic detection element may overlap, when seen in the reference direction, with the surrounding layer. At least a part of the at least one magnetic detection element may not need to overlap, when seen in the reference direction, with the magnetic layer. The magnetic layer may be a yoke configured to generate an output magnetic field including an output magnetic field component in a direction orthogonal to the reference direction when a magnetic field component including an input magnetic field component in a direction parallel to the reference direction is applied to the magnetic layer. The at least one magnetic detection element may be configured to detect an output magnetic field component as a target magnetic field.

In the magnetic sensor according to an embodiment of the technology, a dimension of the surrounding layer in the reference direction may be the same as a dimension of the magnetic layer in the reference direction.

The magnetic sensor according to an embodiment of the technology may further include an insulating layer. The surrounding layer may have a third surface and a fourth surface located opposite to each other in the reference direction and an outer peripheral surface connecting the third surface and the fourth surface. The insulating layer may be disposed entirely covering the outer peripheral surface of the surrounding layer. The magnetic sensor according to an embodiment of the technology may further include an insulating film disposed covering the magnetic layer, the surrounding layer, and the insulating layer.

In the magnetic sensor according to an embodiment of the technology, no nonmagnetic layer may be provided between the first surface and the second surface of the magnetic layer.

In the magnetic sensor according to an embodiment of the technology, the at least one magnetic detection element may include a plurality of magnetic detection elements.

A magnetic sensor according to another embodiment of the technology includes: a magnetic detection element configured to detect a target magnetic field; a magnetic layer having a first surface and a second surface located opposite to each other in a reference direction and a side surface connecting the first surface and the second surface; and a surrounding layer that is formed of an organic material or a glass material and that is disposed entirely covering the side surface of the magnetic layer. The magnetic detection element is disposed at a position closer to the first surface than the second surface. The magnetic detection element overlaps, when seen in the reference direction, with the magnetic layer but not with the surrounding layer.

In the magnetic sensor according to such another embodiment of the technology, the magnetic layer may be a magnetic shield.

A magnetic sensor according to yet another embodiment of the technology includes: a magnetic detection element configured to detect a target magnetic field; a magnetic layer having a first surface and a second surface located opposite to each other in a reference direction and a side surface connecting the first surface and the second surface; and a surrounding layer that is formed of an organic material or a glass material and that is disposed entirely covering the side surface of the magnetic layer. The magnetic detection element is disposed at a position closer to the first surface than the second surface. The magnetic detection element overlaps, when seen in the reference direction, with the surrounding layer. At least a part of the magnetic detection element does not overlap, when seen in the reference direction, with the magnetic layer.

In the magnetic sensor according to such yet another embodiment of the technology, the magnetic layer may be a yoke configured to generate an output magnetic field including an output magnetic field component in a direction orthogonal to the reference direction when a magnetic field component including an input magnetic field component in a direction parallel to the reference direction is applied to the magnetic layer. The magnetic detection element may be configured to detect an output magnetic field component as a target magnetic field.

Obviously, various modification examples and variations of the technology are possible in the light of the above teachings. Thus, it is to be understood that, within the scope of the appended claims and equivalents thereof, the technology may be practiced in other embodiments than the foregoing example embodiments.

What is claimed is:

1. A magnetic sensor comprising:

at least one magnetic detection element configured to detect a target magnetic field;

a magnetic layer having a first surface and a second surface located opposite to each other in a reference direction and a side surface connecting the first surface and the second surface;

a surrounding layer that is formed of an organic material or a glass material and that is disposed entirely covering the side surface of the magnetic layer; and an insulating layer, wherein the at least one magnetic detection element is disposed at a position closer to the first surface than the second surface, the surrounding layer is not provided between the first surface of the magnetic layer and the at least one magnetic detection element in the reference direction, and the surrounding layer has a third surface and a fourth surface located opposite to each other in the reference direction and an outer peripheral surface connecting the third surface and the fourth surface, and the insulating layer is disposed entirely covering the outer peripheral surface of the surrounding layer.

2. The magnetic sensor according to claim 1, wherein the surrounding layer is not provided at a position facing the second surface of the magnetic layer in the reference direction.

3. The magnetic sensor according to claim 1, wherein the at least one magnetic detection element overlaps, when seen in the reference direction, with the magnetic layer but not with the surrounding layer.

4. The magnetic sensor according to claim 3, wherein the magnetic layer is a magnetic shield.

5. The magnetic sensor according to claim 1, wherein the at least one magnetic detection element overlaps, when seen in the reference direction, with the surrounding layer, and at least a part of the at least one magnetic detection element does not overlap, when seen in the reference direction, with the magnetic layer.

6. The magnetic sensor according to claim 5, wherein the magnetic layer is a yoke configured to generate an output magnetic field including an output magnetic field component in a direction orthogonal to the reference direction when a magnetic field component including an input magnetic field component in a direction parallel to the reference direction is applied to the magnetic layer, and the at least one magnetic detection element is configured to detect the output magnetic field component as the target magnetic field.

7. The magnetic sensor according to claim 1, wherein a dimension of the surrounding layer in the reference direction is the same as a dimension of the magnetic layer in the reference direction.

8. The magnetic sensor according to claim 1, further comprising an insulating film disposed covering the magnetic layer, the surrounding layer, and the insulating layer.

9. The magnetic sensor according to claim 1, wherein no nonmagnetic layer is provided between the first surface and the second surface of the magnetic layer.

10. The magnetic sensor according to claim 1, wherein the at least one magnetic detection element includes a plurality of magnetic detection elements.

11. A magnetic sensor comprising:

a magnetic detection element configured to detect a target magnetic field;

a magnetic layer having a first surface and a second surface located opposite to each other in a reference direction and a side surface connecting the first surface and the second surface;

a surrounding layer that is formed of an organic material or a glass material and that is disposed entirely covering the side surface of the magnetic layer; and an insulating layer, wherein the magnetic detection element is disposed at a position closer to the first surface than the second surface, and the magnetic detection element overlaps, when seen in the reference direction, with the magnetic layer but not with the surrounding layer, the surrounding layer has a third surface and a fourth surface located opposite to each other in the reference direction and an outer peripheral surface connecting the third surface and the fourth surface, and the insulating layer is disposed entirely covering the outer peripheral surface of the surrounding layer.

12. The magnetic sensor according to claim 11, wherein the magnetic layer is a magnetic shield.

13. A magnetic sensor comprising:

a magnetic detection element configured to detect a target magnetic field;

a magnetic layer having a first surface and a second surface located opposite to each other in a reference direction and a side surface connecting the first surface and the second surface; and a surrounding layer that is formed of an organic material or a glass material and that is disposed entirely covering the side surface of the magnetic layer, wherein the magnetic detection element is disposed at a position closer to the first surface than the second surface, the magnetic detection element overlaps, when seen in the reference direction, with the surrounding layer, at least a part of the magnetic detection element does not overlap, when seen in the reference direction, with the magnetic layer, the magnetic layer is a yoke configured to generate an output magnetic field including an output magnetic field component in a direction orthogonal to the reference direction when a magnetic field component including an input magnetic field component in a direction parallel to the reference direction is applied to the magnetic layer, and the magnetic detection element is configured to detect the output magnetic field component as the target magnetic field.

14. A magnetic sensor comprising:

at least one magnetic detection element configured to detect a target magnetic field;

a magnetic layer having a first surface and a second surface located opposite to each other in a reference direction and a side surface connecting the first surface and the second surface; and a surrounding layer that is formed of an organic material or a glass material and that is disposed entirely covering the side surface of the magnetic layer, wherein the at least one magnetic detection element is disposed at a position closer to the first surface than the second surface, the surrounding layer is not provided between the first surface of the magnetic layer and the at least one magnetic detection element in the reference direction, and the first surface, the surrounding layer and the at least one magnetic detection element are arranged in this order along the reference direction, and no structure exists other than the surrounding layer that is formed of the organic material or the glass material between the first surface of the magnetic layer and the at least one magnetic detection element in this order.

* * * * *